(12) United States Patent
Wu et al.

(10) Patent No.: US 12,395,156 B1
(45) Date of Patent: Aug. 19, 2025

(54) TERMINAL CORRECTION CIRCUIT

(71) Applicant: Winbond Electronics Corp., Taichung (TW)

(72) Inventors: Chen-Yu Wu, Hsinchu (TW); Tzu-Chao Wu, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 64 days.

(21) Appl. No.: 18/597,938

(22) Filed: Mar. 7, 2024

(30) Foreign Application Priority Data

Feb. 1, 2024 (TW) .................................. 113103964

(51) Int. Cl.
*H03K 3/0233* (2006.01)
*H03K 3/011* (2006.01)
*H03K 5/24* (2006.01)

(52) U.S. Cl.
CPC ........... *H03K 3/0233* (2013.01); *H03K 3/011* (2013.01); *H03K 5/2481* (2013.01)

(58) Field of Classification Search
CPC .... H03K 3/0233; H03K 3/011; H03K 5/2481; H03K 19/0005; H03K 19/017545; H04L 25/0278; H04L 25/0272; H04L 25/028; H04L 25/0298; H04L 25/0292; H01L 2924/3011; H01L 2924/30111; H03H 7/40; H03H 7/38; H03H 11/28; H01R 13/6473
See application file for complete search history.

(56) References Cited

U.S. PATENT DOCUMENTS 9,525,571 B2 12/2016 Ruberg et al.

*Primary Examiner* — Lincoln D Donovan
*Assistant Examiner* — James G Yeaman
(74) *Attorney, Agent, or Firm* — JCIPRNET

(57) ABSTRACT

A terminal correction circuit includes a first terminal replica model, a terminal voltage offset correction circuit, a second terminal replica model and a terminal resistance offset correction circuit. The first terminal replica model sets a resistance ratio of first and second adjustable resistors according to a voltage correction code, thereby adjusting a terminal voltage. The terminal voltage offset correction circuit compares the terminal voltage and a third power supply voltage and provides the voltage correction code according to the comparison result. The second terminal replica model sets a resistance ratio of third and fourth adjustable resistors according to the voltage correction code and reduces an equivalent resistance value between a half-voltage terminal and a ground voltage according to a resistance correction code. The terminal resistance offset correction circuit compares a comparison voltage with a second power supply voltage and provides the resistance correction code according to the comparison result.

16 Claims, 3 Drawing Sheets

TERMINAL CORRECTION CIRCUIT

CROSS-REFERENCE TO RELATED APPLICATION

This application claims the priority benefit of Taiwan application serial no. 113103964, filed on Feb. 1, 2024. The entirety of the above-mentioned patent application is hereby incorporated by reference herein and made a part of this specification.

BACKGROUND

Technical Field

The present disclosure relates to a correction technology, and in particular to a terminal correction circuit for correcting a high-speed transmission interface.

Description of Related Art

In high-speed transmission interfaces, the terminal resistance (Rtt) of the transmitter or receiver is very important for impedance matching during signal transmission, especially in high-speed systems. Generally speaking, the resistance value of the terminal resistance is easily affected by the manufacturing process, voltage and temperature variation (PVT variation), causing the terminal voltage (common-mode voltage) to be unable to maintain a predetermined voltage value. Although there is currently a correction mechanism to offset the terminal resistance, if the two transmission resistances included in the terminal resistance do not match each other, the voltage value of the terminal voltage will still offset from the predetermined voltage value.

SUMMARY

The present disclosure provides a terminal correction circuit that may perform two-stage offset correction to effectively eliminate the effects caused by PVT variation on the terminal resistance and terminal voltage.

A terminal correction circuit of the disclosure includes a first terminal replica model, a terminal voltage offset correction circuit, a second terminal replica model and a terminal resistance offset correction circuit. The first terminal replica model has a first adjustable resistor and a second adjustable resistor. The first adjustable resistor is coupled between the second power supply voltage and the first node, and the second adjustable resistor is coupled between the first node and the ground voltage. The first terminal replica model is configured to set a resistance ratio of the first adjustable resistor and the second adjustable resistor according to a voltage correction code, thereby adjusting a terminal voltage generated by the first node. The terminal voltage offset correction circuit is coupled to the first terminal replica model to compare the terminal voltage with the third power supply voltage and provide a voltage correction code according to the comparison result. The second terminal replica model is coupled to the terminal voltage offset correction circuit and has a third adjustable resistor and a fourth adjustable resistor. The third adjustable resistor is coupled between the half-voltage terminal and the second node, and the fourth adjustable resistor is coupled between the second node and the ground voltage. The second terminal replica model is configured to set the resistance ratio of the third adjustable resistor and the fourth adjustable resistor according to the voltage correction code, and to reduce the equivalent resistance value between the half-voltage terminal and the ground voltage according to the resistance correction code. The terminal resistance offset correction circuit is coupled to the second terminal replica model for comparing the comparison voltage generated at the half-voltage terminal with the second power supply voltage, and providing a resistance correction code according to the comparison result.

Based on the above, the terminal correction circuit of the present disclosure may perform two-stage offset correction to find accurate voltage correction codes and resistance correction codes. In addition to preventing the resistance value of the terminal resistance from offsetting, it is also possible to prevent the voltage of the terminal voltage from offsetting. In this way, the influence caused by PVT variation on the terminal resistance and terminal voltage may be effectively eliminated, making the transmission signal less likely to be distorted.

DESCRIPTION OF THE EMBODIMENTS

Figure 1:
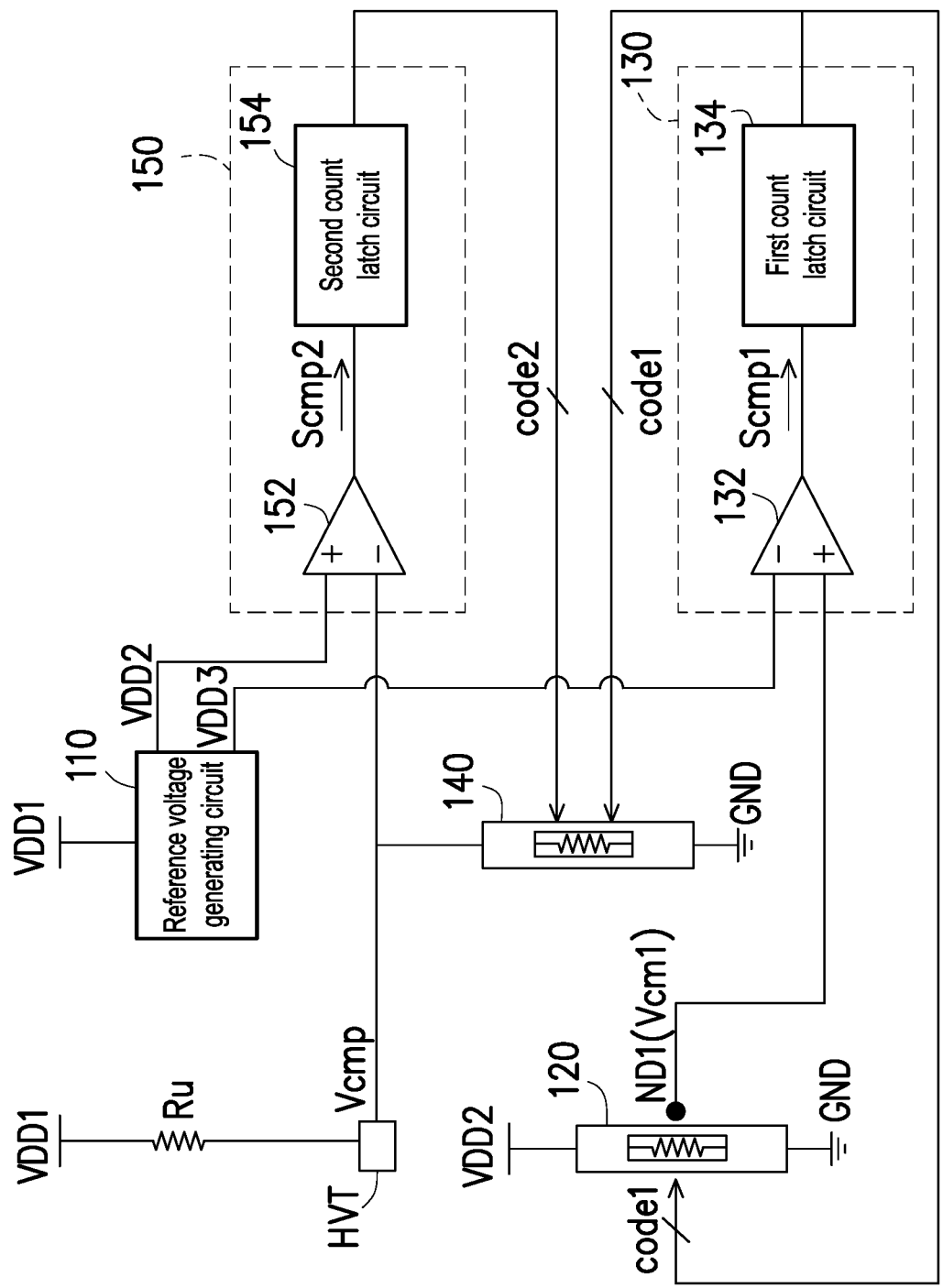
FIG. 1 is a schematic circuit diagram of a terminal correction circuit according to an embodiment of the present disclosure.

Refer to FIG. 1. The terminal correction circuit 100 is adaptable for correcting the terminal resistance and terminal voltage (common-mode voltage) of the transmitter or receiver in the high-speed transmission interface. The terminal correction circuit 100 includes a reference voltage generating circuit 110, a first terminal replica model 120, a terminal voltage offset correction circuit 130, a second terminal replica model 140 and a terminal resistance offset correction circuit 150.

The reference voltage generating circuit 110 is coupled to the terminal voltage offset correction circuit 130 and the terminal resistance offset correction circuit 150. The reference voltage generating circuit 110 may be used to receive the first power supply voltage VDD1, and convert the first power supply voltage VDD1 into the third power supply voltage VDD3 and the second power supply voltage VDD2, and output the third power supply voltage VDD3 and the second power supply voltage VDD2 to the terminal voltage offset correction circuit 130 and the terminal resistance offset correction circuit 150 respectively. The reference voltage generating circuit 110 may be adjusted and corrected in advance so that the voltage value of the second power supply voltage VDD2 is equal to a half of the voltage value of the first power supply voltage VDD1 and the voltage value of the third power supply voltage VDD3 is equal to a quarter of the voltage value of the first power supply voltage VDD1. The first power supply voltage VDD1 is, for example, 1.2 volts.

Figure 2:
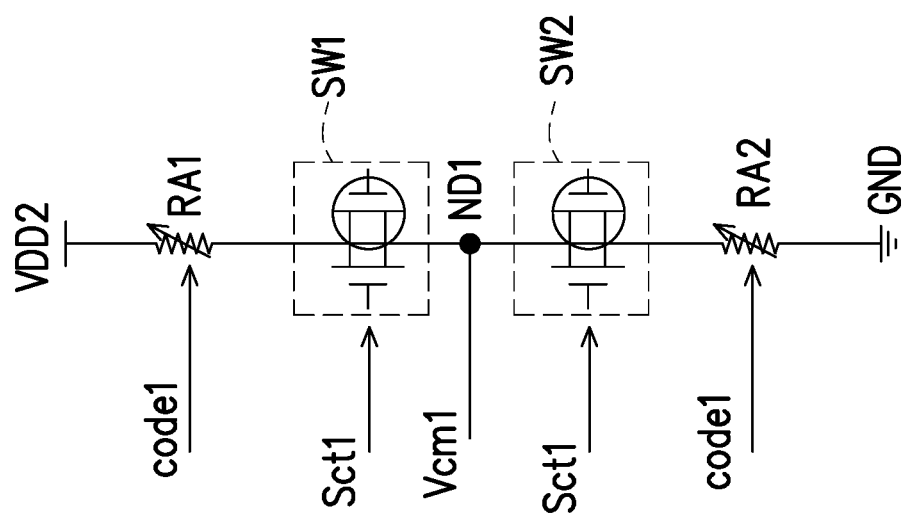
FIG. 2 is a schematic circuit diagram of a first terminal replica model according to an embodiment of the present disclosure.

The first terminal replica model 120 has a first adjustable resistor RA1 and a second adjustable resistor RA2. FIG. 2 illustrates the implementation details of the first terminal replica model 120. Refer to FIG. 1 and FIG. 2. The first adjustable resistor RA1 is coupled between the second power supply voltage VDD2 and the first node ND1. The second adjustable resistor RA2 is coupled between the first node ND1 and the ground voltage GND.

In addition, the first terminal replica model 120 further includes a first switch circuit SW1 and a second switch circuit SW2. The first switch circuit SW1 is connected in series with the first adjustable resistor RA1 on the circuit path between the second power supply voltage VDD2 and the first node ND1, and is turned on or off under the control of the first control signal Sct1. The second switch circuit SW2 is connected in series with the second adjustable resistor RA2 on the circuit path between the first node ND1 and the ground voltage GND, and is also turned on or off under the control of the first control signal Sct1. The first switch circuit SW1 and the second switch circuit SW2 may be composed of, for example, one transistor or two transistors connected in parallel. The first control signal Sct1 comes from an external control circuit, for example. When the offset correction operation is to be performed to enable the first terminal replica model 120, the first switch circuit SW1 and the second switch circuit SW2 may be turned on according to the first control signal Sct1 of a specific logic level. It should be noted that the above-mentioned specific logic level may be logic 1 or logic 0 depending on actual requirements, and there is no fixed limitation.

The first terminal replica model 120 is coupled to the terminal voltage offset correction circuit 130. The first terminal replica model 120 may receive the voltage correction code code1 from the terminal voltage offset correction circuit 130, and set the resistance ratio of the first adjustable resistor RA1 and the second adjustable resistor RA2 according to the voltage correction code code1, thereby adjusting the terminal voltage Vcm1 generated by the first node Nd1. Specifically, the first adjustable resistor RA1 and the second adjustable resistor RA2 may respectively receive the voltage correction code code1, and change the length of the internal resistance access circuit or the number of resistors connected in parallel to each other to adjust the respective resistance values according to the multiple bit values included in the voltage correction code code1.

In this embodiment, relative to the voltage correction code code1, the changing trend of the first adjustable resistor RA1 is opposite to the changing trend of the second adjustable resistor RA2. For example, when the voltage correction code code1 accumulates, the resistance value of the first adjustable resistor RA1 becomes larger, and the resistance value of the second adjustable resistor RA2 becomes smaller. When the voltage correction code code1 decreases, the resistance value of the first adjustable resistor RA1 becomes smaller, and the resistance value of the second adjustable resistor RA2 becomes larger, but the disclosure is not limited thereto. Accordingly, the resistance ratio of the first adjustable resistor RA1 and the second adjustable resistor RA2 may be appropriately set, and the terminal voltage Vcm1 generated by the first node ND1 located between the first adjustable resistor RA1 and the second adjustable resistor RA2 will also change accordingly.

The terminal voltage offset correction circuit 130 may be used to compare the terminal voltage Vcm1 and the third power supply voltage VDD3, and provide a voltage correction code code1 according to the comparison result. Specifically, in FIG. 1, the terminal voltage offset correction circuit 130 includes a first comparator 132 and a first count latch circuit 134. The non-inverting input terminal of the first comparator 132 is coupled to the first node ND1. The inverting input terminal of the first comparator 132 receives the third power supply voltage VDD3. The output terminal of the first comparator 132 outputs the first comparison signal Scmp1. When the terminal voltage Vcm1 generated by the first node ND1 is greater than the third power supply voltage VDD3, the output terminal of the first comparator 132 outputs the first comparison signal Scmp1 with a high logic level. When the terminal voltage Vcm1 is less than the third power supply voltage VDD3, the output terminal of the first comparator 132 outputs the first comparison signal Scmp1 with a low logic level.

The first count latch circuit 134 is coupled to the output terminal of the first comparator 132. The first count latch circuit 134 may adjust the output voltage correction code code1 according to the first comparison signal Scmp1. Specifically, the first count latch circuit 134 may initially provide the voltage correction code code1 with a preset initial value, and then accumulate or decrement the voltage correction code code1 from the initial value in response to the logic level of the first comparison signal Scmp1.

Figure 3:
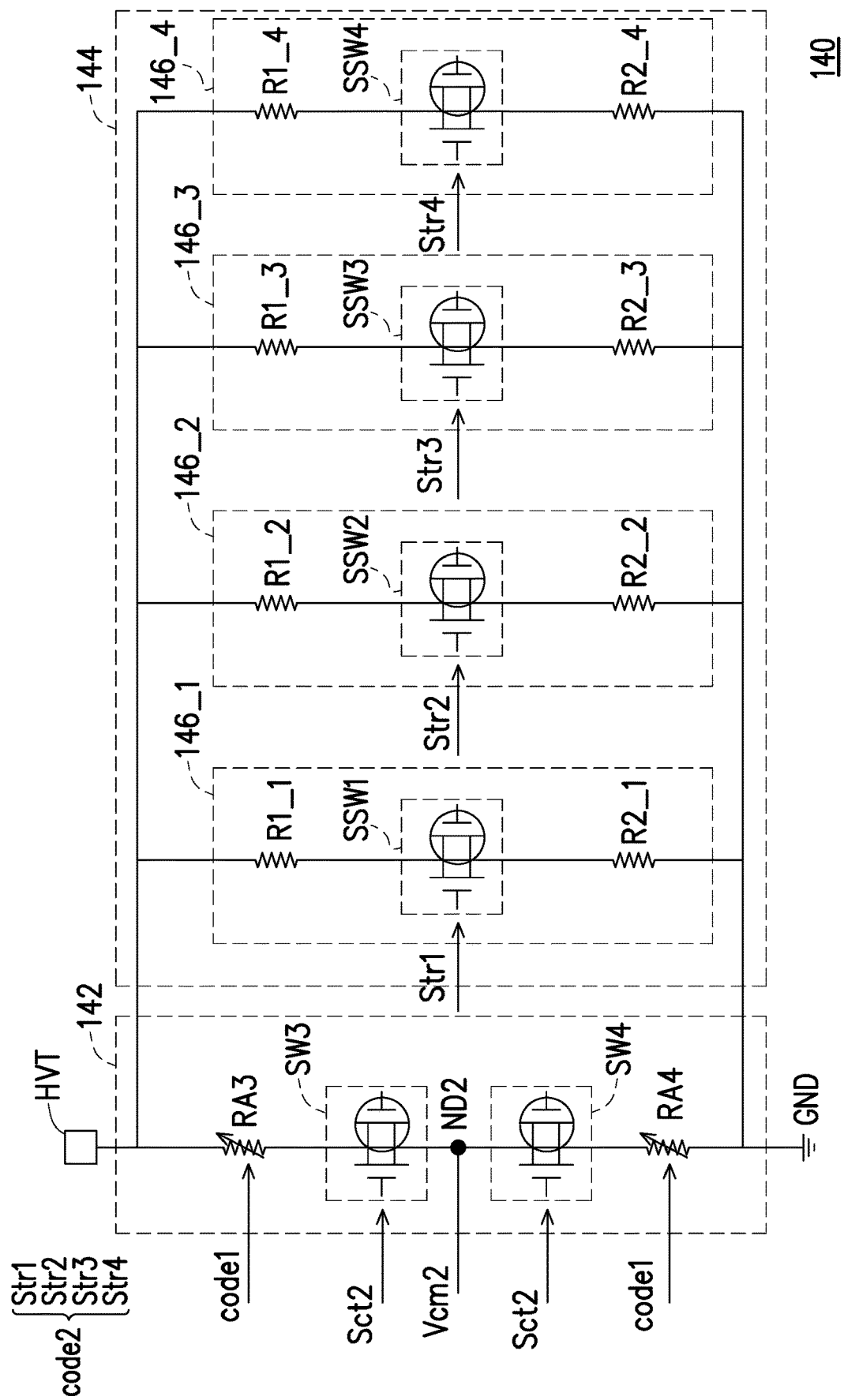
FIG. 3 is a schematic circuit diagram of a second terminal replica model according to an embodiment of the present disclosure.

The second terminal replica model 140 has a third adjustable resistor RA3 and a fourth adjustable resistor RA4. FIG. 3 illustrates the implementation details of the second terminal replica model 140. Refer to FIG. 1 and FIG. 3 both. The second terminal replica model 140 includes a terminal replica circuit 142 and a resistance correction circuit 144.

The terminal replica circuit 142 includes a third adjustable resistor RA3, a fourth adjustable resistor RA4, a third switch circuit SW3 and a fourth switch circuit SW4. The third adjustable resistor RA3 is coupled between the half-voltage terminal HVT and the second node ND2, and the fourth adjustable resistor RA4 is coupled between the second node ND2 and the ground voltage GND. In the terminal correction circuit 100, a pull-up resistor Ru is coupled between the first power supply voltage VDD1 and the half-voltage terminal HVT. The pull-up resistor Ru is, for example, 100 ohms.

The third switch circuit SW3 is connected in series with the third adjustable resistor RA3 on the circuit path between the half-voltage terminal HVT and the second node ND2, and is turned on or off under the control of the second control signal Sct2. The fourth switch circuit SW4 is connected in series with the fourth adjustable resistor RA4 on the circuit path between the second node ND2 and the ground voltage GND, and is also turned on or off under the control of the second control signal Sct2. The third switch circuit SW3 and the fourth switch circuit SW4 may be composed of, for example, one transistor or two transistors connected in parallel. The second control signal Sct2 comes from an external control circuit, for example. When the offset correction operation is to be performed to enable the second terminal replica model 140, the third switch circuit SW3 and the fourth switch circuit SW4 may be turned on according to the second control signal Sct2 of a specific logic level.

The second terminal replica model 140 is coupled to the terminal voltage offset correction circuit 130 and the terminal resistance offset correction circuit 150. The terminal replica circuit 142 in the second terminal replica model 140 may receive the voltage correction code code1 from the terminal voltage offset correction circuit 130, and set the resistance ratio of the third adjustable resistor RA3 and the fourth adjustable resistor RA4 according to the voltage correction code code1. Specifically, the third adjustable resistor RA3 and the fourth adjustable resistor RA4 may respectively receive the voltage correction code code1, and change the length of the internal resistance access circuit or the number of resistors connected in parallel to each other to adjust the respective resistance values according to the multiple bit values contained in the voltage correction code code1.

In this embodiment, the internal detailed structure of the terminal replica circuit 142 is the same as that of the first terminal replica model 120. The first adjustable resistor RA1, the second adjustable resistor RA2, the first switch circuit SW1 and the second switch circuit SW2 are substantially the same as the third adjustable resistor RA3, the fourth adjustable resistor RA4, the third switch circuit SW3 and the fourth switch circuit SW4 respectively, and have the same circuit characteristics. Therefore, when the same voltage correction code code1 is received, the terminal voltage Vcm2 generated by the second node ND2 of the terminal replica circuit 142 is the same as the terminal voltage Vcm1 generated by the first node ND1 of the first terminal replica model 120.

On the other hand, as shown in FIG. 3, the resistance correction circuit 144 includes four resistance circuits 146_1 to 146_4 connected in parallel with the terminal replica circuit 142 between the half-voltage terminal HVT and the ground voltage GND. In FIG. 3, the resistance circuit 146_1 includes a resistor R1_1, a selection switch SSW1 and a resistor R2_1, the resistance circuit 146_2 includes a resistor R1_2, a selection switch SSW2 and a resistor R2_2, the resistance circuit 146_3 includes a resistor R1_3, a selection switch SSW3 and a resistor R2_3, and the resistance circuit 146_4 includes a resistor R1_4, a selection switch SSW4 and a resistor R2_4.

The structures and connections of the four resistance circuits 146_1 to 146_4 are similar. Taking the resistance circuit 146_1 as an example, the first terminal of the resistor R1_1 is coupled to the half-voltage terminal HVT. The first terminal of the selection switch SSW1 is coupled to the second terminal of the resistor R1_1, and the control terminal of the selection switch SSW1 receives the corresponding encoding signal Str1. The first terminal of the resistor R2_1 is coupled to the second terminal of the selection switch SSW1, and the second terminal of the resistor R2_1 is coupled to the ground voltage GND. The resistance value of resistance circuit 146_1 is equal to the sum of the resistance values of resistor R1_1 and resistor R2_1.

The resistance values of the resistors R1_1 to R1_4 are the same as the resistance values of the resistors R2_1 to R2_4 respectively. The resistance values of the resistance circuits 146_1 to 146_4 are respectively the sum of two internal resistors, and the resistance values of the resistance circuits 146_1 to 146_4 are different from each other. For example, the resistance values of the resistance circuits 146_1 to 146_4 may increase from low to high respectively in a manner of binary weight, but the present disclosure is not limited thereto. Those skilled in the art may appropriately replace the resistance in the resistance circuits 146_1 to 146_4 according to their actual needs and the teachings of this embodiment to adjust the resistance values of the resistance circuits 146_1 to 146_4.

The resistance correction circuit 144 in the second terminal replica model 140 may receive the resistance correction code code2 from the terminal resistance offset correction circuit 150, and reduce the equivalent resistance value between the half-voltage terminal HVT and the ground voltage GND according to the resistance correction code code2. Specifically, the four bit values included in the resistance correction code code2 may be respectively provided to the selection switches SSW1 to SSW4 of each resistance circuit 146_1 to 146_4 as corresponding encoding signals Str1 to Str4.

The resistance correction circuit 144 may select to turn on one or more of the resistance circuits 146_1 to 146_4 according to the resistance correction code code2. For example, if the four bit values included in the resistance correction code code2 are 1010, then the encoding signals Str1 and Str3 are logic 1, and the encoding signals Str2 and Str4 are logic 0. Under the circumstances, the resistance circuits 146_1 and 146_3 are turned on, and the resistance circuits 146_2 and 146_4 are turned off. Therefore, the resistance on the resistance circuits 146_1 and 146_3 are connected in parallel with the terminal replica circuit 142 between the half-voltage terminal HVT and the ground voltage GND, thereby reducing the equivalent resistance value between the half-voltage terminal HVT and the ground voltage GND.

In an embodiment, the resistance value of one of the resistance circuits 146_1 to 146_4 may be designed to have a high resistance value (for example, 50 ohms), and the resistance value thereof is greater than other resistance circuits, and is turned on during the entire period of the offset correction operation. For example, when the resistance correction code code2 is a preset initial value, only the resistance circuit with a high resistance value is turned on, and other resistance circuits are turned off. After the resistance correction code code2 is accumulated or decremented from the preset initial value, in addition to the resistance circuit with high resistance value being turned on, other resistance circuits will be turned on as well, thereby reducing the equivalent resistance value between the half-voltage terminal HVT and the ground voltage GND.

The terminal resistance offset correction circuit 150 may be used to compare the comparison voltage Vcmp generated by the half-voltage terminal HVT with the second power supply voltage VDD2, and provide the resistance correction code code2 according to the comparison result. Specifically, in FIG. 1, the terminal resistance offset correction circuit 150 includes a second comparator 152 and a second count latch circuit 154. The non-inverting input terminal of the second comparator 152 receives the second power supply voltage VDD2, the inverting input terminal of the second comparator 152 is coupled to the half-voltage terminal HVT, and the output terminal of the second comparator 152 outputs the second comparison signal Scmp2.

When the second power supply voltage VDD2 is greater than the comparison voltage Vcmp generated by the half-voltage terminal HVT, the output terminal of the second comparator 152 generates the second comparison signal Scmp2 with a high logic level. When the second power supply voltage VDD2 is less than the comparison voltage Vmp, the output terminal of the second comparator 152 generates the second comparison signal Scmp2 with a low logic level.

The second count latch circuit 154 is coupled to the output terminal of the second comparator 152. The second count latch circuit 154 may adjust the output resistance correction code code2 according to the second comparison signal Scmp2. Specifically, the second count latch circuit 154 may initially provide the resistance correction code code2 with a preset initial value, and then accumulate or decrement the resistance correction code code2 from the initial value in response to the logic level of the second comparison signal Scmp2.

Based on the above, the accurate voltage correction code code1 and resistance correction code code2 may be found through the offset correction operation performed by the terminal correction circuit 100, so that the transmission terminal or receiving terminal of the corresponding transmitter or receiver may obtain accurate terminal voltage (common-mode voltage) and terminal resistance. It should be noted that the transmission terminals or receiving terminals of these corresponding transmitters or receivers need to be configured to be the same or similar to the second terminal replica model 140, and the terminal voltage (common-mode voltage) and terminal resistance may be adjusted according to the voltage correction code code1 and the resistance correction code code2.

Specifically, the offset correction operation may be divided into two stages: the first stage and the second stage. In the first stage, the terminal correction circuit 100 will first perform offset correction on the terminal voltage Vcm1 generated by the first node ND1 of the first terminal replica model 120, so that the terminal voltage Vcm1 is equal to the third power supply voltage VDD3. First, the first count latch circuit 134 in the terminal voltage offset correction circuit 130 provides the voltage correction code code1 with a preset initial value to the first terminal replica model 120. Then, the first terminal replica model 120 changes the resistance values of the first adjustable resistor RA1 and the second adjustable resistor RA2 according to the voltage correction code code1 to set the resistance ratio of the first adjustable resistor RA1 and the second adjustable resistor RA2, thereby adjusting the terminal voltage Vcm1 generated by the first node ND1. Next, the first comparator 132 in the terminal voltage offset correction circuit 130 compares the current terminal voltage Vcm1 with the third power supply voltage VDD3, and outputs the first comparison signal Scmp1 to the first count latch circuit 134 according to the comparison result.

The first count latch circuit 134 may continuously accumulate or decrement the voltage correction code code1 from the initial value in response to the logic level of the first comparison signal Scmp1 until the logic level of the first comparison signal Scmp1 changes. For example, when the terminal voltage Vcm1 generated by the initial value (for example, 16) of the voltage correction code code1 is greater than the third power supply voltage VDD3, the first count latch circuit 134 will continuously accumulate the voltage correction code code1 from the initial value in response to the first comparison signal Scmp1 with a high logic level. Under the circumstances, the continuously accumulated voltage correction code code1 will cause the resistance value of the first adjustable resistor RA1 to continue to increase, the resistance value of the second adjustable resistor RA2 to continue to decrease, causing the voltage value of the terminal voltage Vcm1 to continue to decrease. When the terminal voltage Vcm1 decreases to the third power supply voltage VDD3, the first comparison signal Scmp1 will transition to a low logic level, so the first count latch circuit 134 will stop accumulating the voltage correction code code1. Finally, the terminal voltage Vcm1 is fixed to the third power supply voltage VDD3 to complete the correction of the terminal voltage, and the corrected voltage correction code code1 may be stored.

In addition, in an embodiment, the terminal voltage Vcm1 generated by the initial value of the voltage correction code code1 may also be less than the third power supply voltage VDD3. Under the circumstances, the first count latch circuit 134 may also continuously decrease the voltage correction code code1 from the initial value in response to the first comparison signal Scmp1 with a low logic level. The continuously decreasing voltage correction code code1 will cause the resistance value of the first adjustable resistor RA1 to continue to decrease, and the resistance value of the second adjustable resistor RA2 to continue to increase, causing the voltage value of the terminal voltage Vcm1 to continue to increase. When the terminal voltage Vcm1 rises to the third power supply voltage VDD3, the first comparison signal Scmp1 will transition to a high logic level, so the first count latch circuit 134 will stop decrementing the voltage correction code code1. Finally, the terminal voltage Vcm1 is fixed to the third power supply voltage VDD3 to complete the correction of the terminal voltage, and the corrected voltage correction code code1 may be stored.

After the first stage is completed, the voltage correction code code1 provided by the first count latch circuit 134 has been fixed. Under the circumstances, the voltage correction code code1 will also be sent to the terminal replica circuit 142 in the second terminal replica model 140.

Then, in the second stage, the terminal correction circuit 100 performs offset correction on the equivalent resistance value (equivalent to the terminal resistance formed by the second terminal replica model 140) between the half-voltage terminal HVT and the ground voltage GND, making the equivalent resistance value to be equal to the resistance value of the pull-up resistor Ru. First, the second count latch circuit 154 in the terminal resistance offset correction circuit 150 provides the resistance correction code code2 with a preset initial value to the second terminal replica model 140. Then, the resistance correction circuit 144 in the second terminal replica model 140 selects to turn on one or more of the resistance circuits 146_1 to 146_4 according to the resistance correction code code2, so that the conducted resistance circuit and the terminal replica circuit 142 are connected in parallel between the half-voltage terminal HVT and the ground voltage GND, thereby reducing the equivalent resistance value between the half-voltage terminal HVT and the ground voltage GND. Moreover, since the resistance ratio of the third adjustable resistor RA3 and the fourth adjustable resistor RA4 is still fixed, the resistance circuit that is turned on will not affect the corrected terminal voltage Vcm2, which is half the voltage of the half-voltage terminal HVT.

Next, the second comparator 152 in the terminal resistance offset correction circuit 150 will compare the second power supply voltage VDD2 with the comparison voltage Vcmp generated by the current half-voltage terminal HVT, and output the second comparison signal Scmp2 to the second count latch circuit 154 according to the comparison result.

The second count latch circuit 154 may continuously accumulate or decrement the resistance correction code code2 from the initial value in response to the logic level of the second comparison signal Scmp2 until the logic level of the second comparison signal Scmp2 changes. For example, when the comparison voltage Vcmp generated at the half-voltage terminal HVT by the initial value of the resistance correction code code2 is greater than the second power supply voltage VDD2, the second count latch circuit 154 will continuously accumulate the resistance correction code code2 from the initial value in response to the second comparison signal Scmp2 of the low logic level. Under the circumstances, the continuously accumulated resistance correction code code2 will continue to change the resistance circuit that is turned on in the resistance circuits 146_1 to 146_4, causing the comparison voltage Vcmp generated at the half-voltage terminal HVT continue to decrease. When the comparison voltage Vcmp decreases to the second power supply voltage VDD2, the equivalent resistance value between the half-voltage terminal HVT and the ground voltage GND will be equal to the resistance value of the pull-up resistor Ru. Under the circumstances, the second comparison signal Scmp2 will transition to a high logic level, so the second count latch circuit 154 will stop accumulating the resistance correction code code2. Finally, the comparison voltage Vcmp generated at the half-voltage terminal HVT is fixed to the second power supply voltage VDD2, the equivalent resistance value between the half-voltage terminal HVT and the ground voltage GND is equal to the resistance value of the pull-up resistor Ru, allowing the resistance value between the second node ND2 and the half-voltage terminal HVT to maintain matching with the resistance value between the second node ND2 and the ground voltage GND (both are also equal to a half of the resistance value of the pull-up resistor Ru), thereby completing correction of the terminal resistance, and the corrected resistance correction code code2 may be stored.

In this way, as long as the corrected voltage correction code code1 and resistance correction code code2 are applied to the transmission terminal or receiving terminal of the corresponding transmitter or receiver, the accurate terminal voltage (common-mode voltage) and terminal resistance may be obtained.

It should be noted that, depending on the design and decoding method, in an embodiment, the second count latch circuit 154 may also continuously decrease the resistance correction code code2 from the initial value in response to the second comparison signal Scmp2 with a low logic level, so that the comparison voltage Vcmp generated at the half-voltage terminal HVT continues to decrease, thereby completing the correction of the terminal resistance. The present disclosure is not limited thereto.

In addition, although the internal structures of the first terminal replica model 120 and that of the second terminal replica model 140 in this embodiment are different, the disclosure is not limited thereto. In an embodiment, the internal structure of the first terminal replica model 120 may be the same as that of the second terminal replica model 140 and include a terminal replica circuit and a resistance correction circuit, which may also produce the same effect as this embodiment.

Furthermore, although this embodiment is described with the resistance correction circuit 144 including four resistance circuits 146_1 to 146_4, the number of the above components is not limited in the present disclosure. Those skilled in the art may increase the number of resistance circuits in the resistance correction circuit 144 by analogy according to their actual needs and the teachings of this embodiment, thereby improving the precision of correction.

In summary, the terminal correction circuit of the present disclosure may perform two-stage offset correction to find accurate voltage correction codes and resistance correction codes. In addition to preventing the resistance value of the terminal resistance from offsetting, it is also possible to prevent the voltage of the terminal voltage from offsetting. In this way, the influence caused by PVT variation on the terminal resistance and terminal voltage may be effectively eliminated, thereby reducing signal disturbance during transmission of high-speed signals and making signals less likely to be distorted. In the meantime, compared with the current correction mechanism, the area and capacitance value of the circuit will also be reduced, thus achieving the purpose of reducing costs.

What is claimed is:

1. A terminal correction circuit, comprising:
   a first terminal replica model having a first adjustable resistor and a second adjustable resistor, wherein the first adjustable resistor is coupled between a second power supply voltage and a first node, and the second adjustable resistor is coupled between the first node and a ground voltage, the first terminal replica model is configured to set a resistance ratio of the first adjustable resistor and the second adjustable resistor according to a voltage correction code, thereby adjusting a terminal voltage generated by the first node;
   a terminal voltage offset correction circuit coupled to the first terminal replica model to compare the terminal voltage with a third power supply voltage and provide the voltage correction code according to a comparison result;
   a second terminal replica model coupled to the terminal voltage offset correction circuit and having a third adjustable resistor and a fourth adjustable resistor, wherein the third adjustable resistor is coupled between a half-voltage terminal and a second node, and the fourth adjustable resistor is coupled between the second node and the ground voltage, the second terminal replica model is configured to set a resistance ratio of the third adjustable resistor and the fourth adjustable resistor according to the voltage correction code, and to reduce an equivalent resistance value between the half-voltage terminal and the ground voltage according to a resistance correction code; and
   a terminal resistance offset correction circuit coupled to the second terminal replica model for comparing a comparison voltage generated at the half-voltage terminal with the second power supply voltage, and providing the resistance correction code according to a comparison result.

2. The terminal correction circuit according to claim 1, further comprising:
   a reference voltage generating circuit configured to receive a first power supply voltage, and convert the first power supply voltage into the second power supply voltage and the third power supply voltage for output, a voltage value of the second power supply voltage is equal to a half of a voltage value of the first power supply voltage, a voltage value of the third power supply voltage is equal to a quarter of the voltage value of the first power supply voltage.

3. The terminal correction circuit according to claim 1, wherein the terminal voltage offset correction circuit comprises:
   a first comparator, wherein a non-inverting input terminal of the first comparator is coupled to the first node, and an inverting input terminal of the first comparator receives the third power supply voltage, an output terminal of the first comparator outputs a first comparison signal; and
   a first count latch circuit coupled to the output terminal of the first comparator, and adjusting the output voltage correction code according to the first comparison signal.

4. The terminal correction circuit according to claim 3, wherein the terminal resistance offset correction circuit comprises:
   a second comparator, wherein a non-inverting input terminal of the second comparator receives the second power supply voltage, an inverting input terminal of the second comparator is coupled to the half-voltage terminal, and an output terminal of the second comparator outputs a second comparison signal; and
   a second count latch circuit coupled to the output terminal of the second comparator, and adjusting the output resistance correction code according to the second comparison signal.

5. The terminal correction circuit according to claim 4, further comprising:
a pull-up resistor coupled between a first power supply voltage and the half-voltage terminal.

6. The terminal correction circuit according to claim 5, wherein an offset correction operation performed by the terminal correction circuit is able to be divided into a first stage and a second stage, the first stage is configured to make the terminal voltage equal to the third power supply voltage, and the second stage is configured to make the equivalent resistance value between the half-voltage terminal and the ground voltage equal to a resistance value of the pull-up resistor.

7. The terminal correction circuit according to claim 6, wherein in the first stage, the first count latch circuit provides the voltage correction code with an initial value to the first terminal replica model, then the first comparator compares the current terminal voltage with the third power supply voltage, and outputs the first comparison signal to the first count latch circuit according to a comparison result.

8. The terminal correction circuit according to claim 7, wherein in the first stage, the first count latch circuit continuously accumulates or decrements the voltage correction code from the initial value in response to a logic level of the first comparison signal until the logic level of the first comparison signal changes.

9. The terminal correction circuit according to claim 6, wherein in the second stage, the second count latch circuit provides the resistance correction code with an initial value to the second terminal replica model, then the second comparator compares the current second power supply voltage with the comparison voltage, and outputs the second comparison signal to the second count latch circuit according to a comparison result.

10. The terminal correction circuit according to claim 9, wherein in the second stage, the second count latch circuit continuously accumulates or decrements the resistance correction code from the initial value in response to a logic level of the second comparison signal until the logic level of the second comparison signal changes.

11. The terminal correction circuit according to claim 1, wherein the first terminal replica model comprises:
the first adjustable resistor and the second adjustable resistor respectively receiving the voltage correction code and adjusting their respective resistance values according to the voltage correction code to set a resistance ratio of the first adjustable resistor and the second adjustable resistor;
a first switch circuit connected in series with the first adjustable resistor on a circuit path between the second power supply voltage and the first node, and turned on or off under a control of a first control signal; and
a second switch circuit connected in series with the second adjustable resistor on a circuit path between the first node and the ground voltage, and turned on or off under the control of the first control signal.

12. The terminal correction circuit according to claim 1, wherein the second terminal replica model comprises a terminal replica circuit, which comprises:
the third adjustable resistor and the fourth adjustable resistor respectively receiving the voltage correction code and adjusting their respective resistance values according to the voltage correction code to set a resistance ratio of the third adjustable resistor and the fourth adjustable resistor;
a third switch circuit connected in series with the third adjustable resistor on a circuit path between the half-voltage terminal and the second node, and turned on or off under a control of a second control signal; and
a fourth switch circuit connected in series with the fourth adjustable resistor on a circuit path between the second node and the ground voltage, and turned on or off under the control of the second control signal.

13. The terminal correction circuit according to claim 12, wherein the second terminal replica model further comprises a resistance correction circuit, the resistance correction circuit comprises a plurality of resistance circuits connected in parallel with the terminal replica circuit between the half-voltage terminal and the ground voltage, and each of the plurality of resistance circuits comprises:
a first resistor, wherein a first terminal of the first resistor is coupled to the half-voltage terminal;
a selection switch, wherein a first terminal of the selection switch is coupled to a second terminal of the first resistor, and a control terminal of the selection switch receives a corresponding encoding signal; and
a second resistor, wherein a first terminal of the second resistor is coupled to a second terminal of the selection switch and a second terminal of the second resistor is coupled to the ground voltage.

14. The terminal correction circuit according to claim 13, wherein resistance values of the plurality of resistance circuits increase from low to high respectively in a manner of binary weight.

15. The terminal correction circuit according to claim 13, wherein a plurality of bit values contained in the resistance correction code are respectively provided to the selection switch of each of the plurality of resistance circuits as the corresponding encoding signal,
the resistance correction circuit selects to turn on one or more of the resistance circuits according to the resistance correction code, thereby reducing the equivalent resistance value between the half-voltage terminal and the ground voltage.

16. The terminal correction circuit according to claim 13, wherein a resistance value of one of the plurality of resistance circuits is greater than the other resistance circuits, and is turned on during an entire period of an offset correction operation.

* * * * *